United States Patent
Guo et al.

(10) Patent No.: US 12,130,667 B2
(45) Date of Patent: Oct. 29, 2024

(54) ROLLABLE DISPLAY DEVICE AND INTELLIGENT TERMINAL

(71) Applicant: SHENZHEN SKYWORTH-RGB ELECTRONIC CO., LTD., Shenzhen (CN)

(72) Inventors: Yubao Guo, Shenzhen (CN); Weixiong Chen, Shenzhen (CN); Pengfei Yu, Shenzhen (CN); Bosheng Tang, Shenzhen (CN); Tianpeng Han, Shenzhen (CN)

(73) Assignee: SHENZHEN SKYWORTH-RGB ELECTRONIC CO., LTD, Guangdong (CN)

( * ) Notice: Subject to any disclaimer, the term of this patent is extended or adjusted under 35 U.S.C. 154(b) by 682 days.

(21) Appl. No.: 17/293,738

(22) PCT Filed: Sep. 17, 2020

(86) PCT No.: PCT/CN2020/115918
§ 371 (c)(1),
(2) Date: May 13, 2021

(87) PCT Pub. No.: WO2021/077957
PCT Pub. Date: Apr. 29, 2021

(65) Prior Publication Data
US 2022/0004229 A1    Jan. 6, 2022

(30) Foreign Application Priority Data
Oct. 21, 2019    (CN) ........................ 201911002056.X

(51) Int. Cl.
*H05K 5/00*    (2006.01)
*G06F 1/16*    (2006.01)
(Continued)

(52) U.S. Cl.
CPC ............ *G06F 1/1652* (2013.01); *G09F 9/301* (2013.01); *G06F 1/16* (2013.01); *H05K 5/00* (2013.01); *H05K 5/02* (2013.01)

(58) Field of Classification Search
None
See application file for complete search history.

(56) References Cited

U.S. PATENT DOCUMENTS

| 10,410,549 B1* | 9/2019 | Kim ...................... G06F 1/1601 |
| 2019/0064578 A1* | 2/2019 | Cho ...................... H10K 77/111 |

(Continued)

FOREIGN PATENT DOCUMENTS

| CN | 102455586 A | 5/2012 |
| CN | 106257569 A | 12/2016 |

(Continued)

OTHER PUBLICATIONS

The World Intellectual Property Organization (WIPO) International Search Report for PCT/CN2020/115918 Dec. 16, 2020 6 Pages (including translation).

*Primary Examiner* — Phi D A
(74) *Attorney, Agent, or Firm* — Samson G. Yu

(57) ABSTRACT

The present disclosure provides a rollable display device and an intelligent terminal. The rollable display device comprises flexible display screen, lifting mechanism connected to a top end of the flexible display screen, and rollable screen mechanism connected to a bottom end of the flexible display screen, wherein the lifting mechanism is configured to drive the flexible display screen to move up or down; and the rollable screen mechanism is configured to unfold the flexible display screen when the lifting mechanism drives the flexible display screen to move up or roll up the flexible display screen when the lifting mechanism drives the flexible display screen to move down, thereby realizing lifting and rolling of the screen with no limitation to the volume of (Continued)

the display screen, reducing the occupied space of the display screen, overcoming the problem that the traditional display device is not portable and bringing convenience to users.

10 Claims, 8 Drawing Sheets

(51) Int. Cl.
   *G09F 9/30* (2006.01)
   *H05K 5/02* (2006.01)

(56) References Cited

U.S. PATENT DOCUMENTS

| | | | |
|---|---|---|---|
| 2019/0138058 A1 | 5/2019 | Kwon et al. | |
| 2019/0278335 A1* | 9/2019 | Yeh | G09F 9/301 |
| 2020/0013317 A1* | 1/2020 | Cho | H05K 5/0217 |
| 2020/0035133 A1* | 1/2020 | Pyo | F16M 13/02 |
| 2020/0077194 A1* | 3/2020 | Kim | H04R 9/025 |
| 2020/0160760 A1* | 5/2020 | Park | G09F 9/301 |
| 2020/0201394 A1* | 6/2020 | Choi | G06F 1/1652 |

FOREIGN PATENT DOCUMENTS

| | | |
|---|---|---|
| CN | 106816094 A | 6/2017 |
| CN | 107170371 A | 9/2017 |
| CN | 206634995 U | 11/2017 |
| CN | 107424517 A | 12/2017 |
| CN | 207115916 U | 3/2018 |
| CN | 108064402 A | 5/2018 |
| CN | 109219843 A | 1/2019 |
| CN | 109564742 A | 4/2019 |
| CN | 109887417 A | 6/2019 |
| CN | 209418055 U | 9/2019 |
| CN | 209448773 U | 9/2019 |
| CN | 110751907 A | 2/2020 |
| EP | 3173897 A1 | 5/2017 |
| JP | 2010078684 A | 4/2010 |
| JP | 3185983 U | 9/2013 |
| KR | 20180107065 A | 10/2018 |

* cited by examiner

ROLLABLE DISPLAY DEVICE AND INTELLIGENT TERMINAL

CROSS-REFERENCES TO RELATED APPLICATIONS

This application is a national stage application of PCT Patent Application No. PCT/CN2020/115918, filed on Sep. 17, 2020, which claims priority to Chinese Patent Application No. 201911002056.X, filed on Oct. 21, 2019, the content of all of which is incorporated herein by reference.

FIELD OF THE APPLICATION

The present disclosure relates to the field of display technology, and to a rollable display device and an intelligent terminal.

BACKGROUND

With the rapid development of the screen display technology, various display devices can be seen everywhere in daily life, such as the common liquid crystal television, or the display of the computer and the like, however, most of the display devices are inconvenient to carry because the screen has large volume, the foldable mobile terminal has appeared in the prior art, the mobile terminal is convenient to carry by folding the screen, however, the folding technology has a certain limitation, the mobile terminals with small volume may be folded to play a role in folding, but the display device with the larger screen cannot meet the requirement of users on portability.

Therefore, the prior art needs to be further improved.

BRIEF SUMMARY OF THE DISCLOSURE

In view of the above shortcomings in the prior art, an objective of the present disclosure is to provide a rollable display device and an intelligent terminal for users, thus solving the technical problem in the prior art that the display device is not portable.

The present disclosure solves the technical problem by the following technical solution:

a rollable display device comprises a flexible display screen, a lifting mechanism connected to a top end of the flexible display screen, and a rollable screen mechanism connected to a bottom end of the flexible display screen, wherein the lifting mechanism is configured to drive the flexible display screen to move up or down; and the rollable screen mechanism is configured to unfold the flexible display screen when the lifting mechanism drives the flexible display screen to move up or roll up the flexible display screen when the lifting mechanism drives the flexible display screen to move down.

Further, the lifting mechanism comprises: a cross beam, a supporting frame, and a connecting rod assembly and a push rod assembly which are arranged on the supporting frame;

the cross beam is connected to the top end of the flexible display screen;

the connecting rod assembly is connected to the cross beam and is configured to drive the cross beam to move up or down; and the push rod assembly is connected to the connecting rod assembly and is configured to transmit power to the connecting rod assembly.

Further, in the rollable display device, the supporting frame is provided with a first sliding groove and a second sliding groove; the connecting rod assembly comprises a first connecting rod, a second connecting rod, a first connecting piece, a second connecting piece, a third connecting rod and a fourth connecting rod;

one end of the first connecting rod and one end of the second connecting rod are connected to two ends of the cross beam respectively, the other end of the first connecting rod is connected to one end of the third connecting rod through the first connecting piece, and the other end of the second connecting rod is connected to one end of the fourth connecting rod through the second connecting piece; and the other end of the third connecting rod and the other end of the fourth connecting rod are connected to the push rod assembly respectively through the first sliding groove and the second sliding groove.

Further, in the rollable display device, the supporting frame comprises a web plate and a wing plate; and the web plate is vertical to the wing plate, and the first sliding groove and the second sliding groove are symmetrically formed in the web plate.

Further, in the rollable display device, each of the third connecting rod and the fourth connecting rod is provided with a corner, and the corner of the third connecting rod and the corner of the fourth connecting rod are respectively arranged at two ends of the web plate. Further, in the rollable display device, each of the first connecting piece and the second connecting piece is engaged through a gear.

Further, in the rollable display device, the first connecting piece comprises a gear structure arranged at the other end of the first connecting rod and a gear structure arranged at one end of the third connecting rod, one end of the first connecting rod being engaged with one end of the third connecting rod; and the second connecting piece comprises a gear structure arranged at the other end of the second connecting rod and a gear structure arranged at one end of the fourth connecting rod, the other end of the second connecting rod being engaged with one end of the fourth connecting rod.

Further, in the rollable display device, the push rod assembly comprises a power push rod, a first driven push rod, a second driven push rod and a third driven push rod;

the power push rod is fixedly arranged on the supporting frame and is connected to one end of the second driven push rod and one end of the third driven push rod;

the other end of the second driven push rod is connected to one end of the first driven push rod; and the other end of the first driven push rod and the other end of the third driven push rod are connected to the connecting rod assembly respectively.

Further, in the rollable display device, the push rod assembly further comprises a fixed base, and a power gear, a transmission gear, a first gear push rod and a second gear push rod which are arranged on the fixed base; and the fixed base is arranged on the supporting frame, the transmission gear is engaged with the power gear, one end of the first rack push rod and one end of the second rack push rod respectively, and the other end of the first rack push rod and the other end of the second rack push rod are connected to the connecting rod assembly respectively.

Further, in the rollable display device, the push rod assembly further comprises a power push rod, a fixed base, and a transmission gear, a first gear push rod and a second gear push rod which are arranged on the fixed base; and the power push rod and the fixed base are arranged on the supporting frame, the transmission gear is engaged with one end of the first rack push rod and one end of the second rack push rod respectively, the other end of the first rack push rod is connected to the power push rod and the connecting rod assembly respectively, and the other end of the second rack push rod is connected to the connecting rod assembly.

Further, in the rollable display device, the push rod assembly further comprises: a first power push rod and a second power push rod; and one end of the first power push rod and one end of the second push rod are arranged on the supporting frame, and the other end of the first power push rod and the other end of the second power push rod are connected to the connecting rod assembly respectively.

Further, in the rollable display device, the rollable screen mechanism comprises: a winding shaft, a first shaft base, a second shaft base, a first coil spring, a second coil spring and a limiting shaft;

the winding shaft is arranged in the middle of the first shaft base and the second shaft base and is connected to the bottom end of the flexible display screen, the first shaft base and the second shaft base are symmetrically arranged on the supporting base;

one end of the first coil spring and one end of the second coil spring are connected to the first shaft base and the second shaft base respectively, and the other end of the first coil spring and the other end of the second coil spring are connected to two ends of the winding shaft respectively; and the limiting shaft is arranged obliquely above the winding shaft parallelly, and two ends of the limiting shaft are connected to the first shaft base and the second shaft base respectively.

Further, in the rollable display device, a plurality of flat metal laths are stuck at the back of the flexible display screen.

Further, in the rollable display device, a step is arranged at an axis direction of the winding shaft, and a thickness of the step is consistent with a thickness of the flexible display screen.

An intelligent terminal comprises the above rollable display device.

The beneficial effects are as follows: the present disclosure provides a rollable display device and an intelligent terminal. The rollable display device comprises a flexible display screen, a lifting mechanism connected to a top end of the flexible display screen, and a rollable screen mechanism connected to a bottom end of the flexible display screen, wherein the lifting mechanism is configured to drive the flexible display screen to move up or down; and the rollable screen mechanism is configured to unfold the flexible display screen when the lifting mechanism drives the flexible display screen to move up or roll up the flexible display screen when the lifting mechanism drives the flexible display screen to move down, thereby realizing lifting and rolling of the screen with no limitation to the volume of the display screen, greatly reducing the occupied space of the display screen, overcoming the problem that the traditional display device is not portable and bringing convenience to users.

DETAILED DESCRIPTION

To make the objectives, technical solutions and advantages of the present disclosure clearer, the present disclosure is further described below in detail with reference to the accompanying drawings and embodiments. It should be understood that the specific embodiments described herein are only for explaining the present disclosure, rather than for limiting the present disclosure.

Embodiment 1

Figure 1:
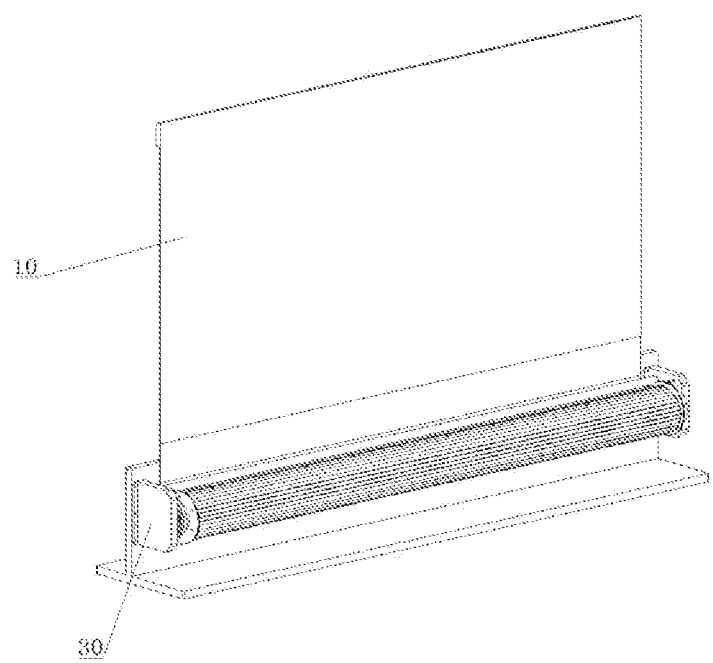
FIG. 1 illustrates a schematic diagram of a front structure of a rollable display device according to the present disclosure.
Figure 2:
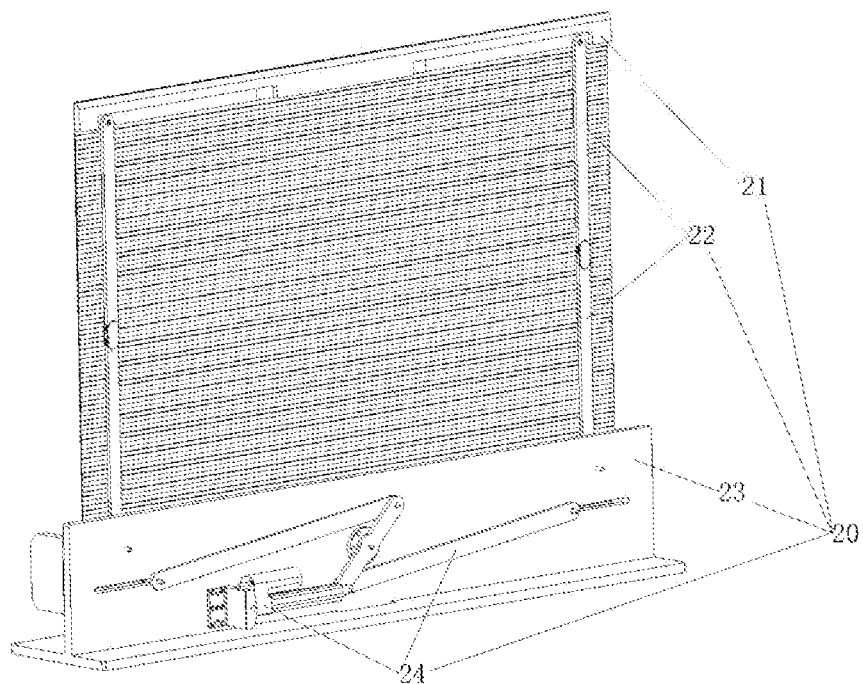
FIG. 2 illustrates a schematic structural diagram of a back structure of a rollable display device according to the present disclosure.

Referring to FIG. 1 and FIG. 2, a rollable display device comprises a flexible display screen 10, a lifting mechanism 20 connected to a top end of the flexible display screen 10, and a rollable screen mechanism 30 connected to a bottom end of the flexible display screen, wherein the lifting mechanism 20 is configured to drive the flexible display screen 10 to move up or down; and The rollable screen mechanism 30 is configured to unfold the flexible display screen 10 when the lifting mechanism 20 drives the flexible display screen 10 to move up or roll up the flexible display screen 10 when the lifting mechanism 20 drives the flexible display screen 10 to move down.

In the embodiment, since bending deformation with a certain radius is required, the flexible display screen may adopt an organic electroluminescence display (OLED), certainly may adopt other flexible screen body that may be bent, and certainly may adopt a non-luminance flexible screen such as a projection screen, which is not specifically limited in the present disclosure. The rollable screen mechanism unfold a flexible display screen which is rolled in advance when the lifting mechanism drives the flexible screen to move up, or the rollable screen mechanism rolls the flexible display screen when the lifting mechanism drives the flexible display screen to move down, thereby realizing the lifting and rolling of the flexible screen.

Referring to FIG. 2, the lifting mechanism comprises: a cross beam 21, a supporting frame 23, and a connecting rod assembly 22 and a push rod assembly 24 which are arranged on the supporting frame;

the cross beam 21 is connected to the top end of the flexible display screen 10;

the connecting rod assembly 22 is connected to the cross beam 21 and is configured to drive the cross beam 21 to move up or down; and the push rod assembly 24 is connected to the connecting rod assembly 22 and is configured to transmit power to the connecting rod assembly 22.

In the embodiment, the top end of the back of the flexible display screen 10 is connected with the cross beam 21 with high strength, and a driving force in the lifting mechanism 20 transmits an action force through the cross beam 21 to drive the flexible display screen 10 to act, so that realizing the lifting mechanism 20 drives the flexible display screen 10 to move up or down to act. When the lifting mechanism 20 drives the flexible display screen 10 to move up to act, the driving force in the lifting mechanism 20 is transmitted to the cross beam 21, the cross beam drives the top end of the flexible display screen 10 to move upward, a bottom end part of the flexible display screen 10 drives the rollable screen mechanism to rotate and the rollable screen mechanism 30 releases the rolled flexible display screen 10. When the lifting mechanism 20 drives the flexible display screen 10 to move down, the driving force in the lifting mechanism 20 is transmitted to the cross beam 21, the cross beam drives the top end of the flexible display screen 10 to move downward, and the bottom end part of the flexible display screen 10 is rolled along with rotation of the rollable screen mechanism 30.

Figure 3:
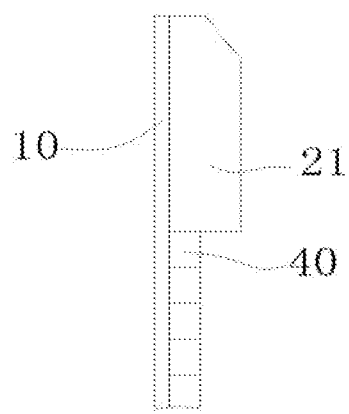
FIG. 3 illustrates a schematic diagram of a screen body structure of a flexible display screen according to the present disclosure.

Referring to FIG. 2 and FIG. 3, a plurality of flat metal laths 40 are stuck at the back, located below the cross beam 21, of the flexible display screen 10 sequentially and tightly. It is worth mentioning that the cross beam 21 not only plays a role in connecting the flexible display screen 10 to the lifting mechanism 20, but also plays a role in enhancing a screen body strength of the flexible display screen and supporting the screen body. Moreover, the plurality of flat metal laths 40 which are stuck at the back, located below the cross beam 21, of the flexible display screen 10 sequentially and tightly may enhance the screen body strength to facilitate rolling and unfolding of the screen body, may also dissipate heat of the screen body, is an appearance piece and may be treated with various colors and surfaces.

Figure 4:
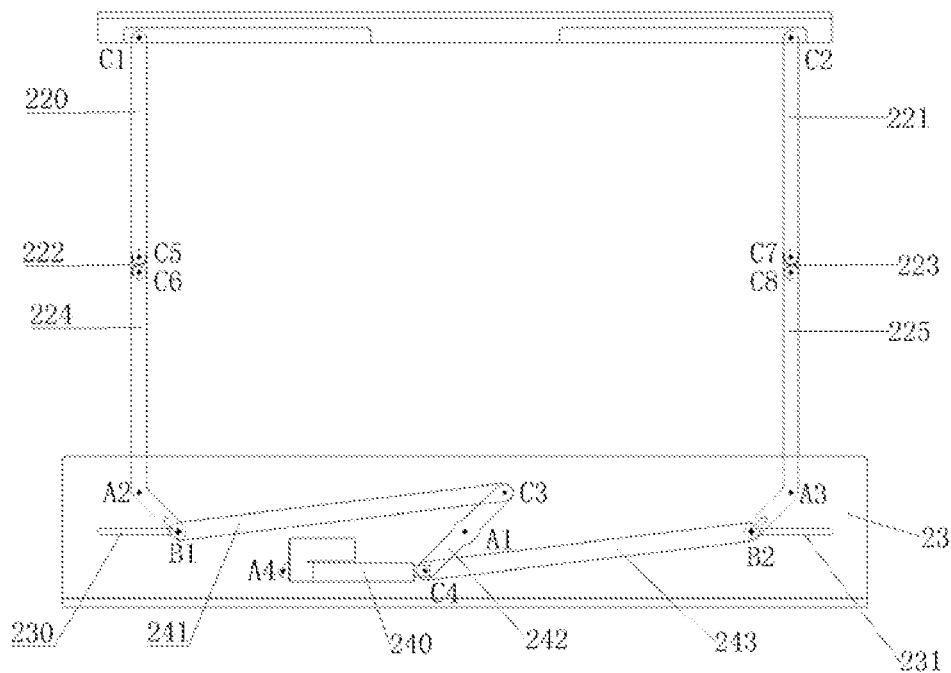
FIG. 4 illustrates a structural schematic diagram of a lifting mechanism of a rollable display device according to the present disclosure.

Referring to FIG. 4, the supporting frame 23 is provided with a first sliding groove 230 and a second sliding groove 231; the connecting rod assembly 22 comprises a first connecting rod 220, a second connecting rod 221, a first connecting piece 222, a second connecting piece 223, a third connecting rod 224 and a fourth connecting rod 225;

one end of the first connecting rod 220 and one end of the second connecting rod 221 are respectively connected to two ends of the cross beam 21, the other end of the first connecting rod 220 is connected to one end of the third connecting rod 224 through the first connecting piece 222, and the other end of the second connecting rod 221 is connected to one end of the fourth connecting rod 225 through the second connecting piece 223; and the other end of the third connecting rod 224 and the other end of the fourth connecting rod 225 are connected to the push rod assembly 24 respectively through the first sliding groove 230 and the second sliding groove 231.

In the embodiment, the supporting frame 23 in the lifting mechanism 20 is inverted T-shaped, the supporting frame comprises a web plate and a wing plate, the web plate is vertical to the wing plate (in the T-shaped structure, a vertical part is the web plate and a transverse part is the wing plate) and is symmetrically provided with penetrating first sliding groove 230 and second sliding groove 231, the connecting rod assembly 22 is located on one side of the supporting frame 23 and is connected to the push rod assembly 24 located on the other side of the supporting frame 23 through a rotating shaft placed in the first sliding groove 230 and the second sliding groove 231, the connecting rod assembly 22 is connected to two ends of the cross beam 21 and the push rod assembly 24 respectively, and telescoping motion generated by the push rod assembly 24 drives the change of a shape of the connecting rod assembly, so that the cross beam 21 drives the flexible display screen 10 to move up or down.

Specifically, a rotating shaft C1 and a rotating shaft C2 are arranged at the left end and the right end of the cross beam 21 respectively, one end of the first connecting rod 220 is connected to the left end of the cross beam through the rotating shaft C1, and one end of the second connecting rod 221 is connected to the right end of the cross beam through the rotating shaft C2; the other end of the first connecting rod 220 is connected to one end of the third connecting rod 224 through the first connecting piece 222, and the other end of the second connecting rod 221 is connected to one end of the fourth connecting rod 225 through the second connecting piece 223; and the other end of the third connecting rod 224 is connected to the push rod assembly 24 located on the other side of the web plate of the supporting frame 23 through a rotating shaft B1 in the first sliding groove 230, and the other end of the fourth connecting rod 225 is connected to the push rod assembly 24 located on the other side of the web plate of the supporting frame through a rotating shaft B2 in the second sliding groove 231.

It should be noted that each of the third connecting rod 224 and the fourth connecting rod 225 is provided with a corner of 135 degrees, and the corner of the third connecting rod 224 and the corner of the fourth connecting rod 225 are arranged at two ends of the web plate respectively through a rotating shaft A2 and a rotating shaft A3.

Please continue to refer to FIG. 4, the push rod assembly 24 comprises a power push rod 240, a first driven push rod 241, a second driven push rod 242 and a third driven push rod 243;

the power push rod 240 is fixedly arranged on the supporting frame 23 and is connected to one end of the second driven push rod 242 and one end of the third driven push rod 243;

the other end of the second driven push rod 242 is connected to one end of the first driven push rod 241; and the other end of the first driven push rod 241 and the other end of the third driven push rod 243 are connected to the connecting rod assembly 22 respectively.

In the embodiment, the power push rod 240 is fixedly arranged on the supporting frame 23 through a rotating shaft A4 and is connected to one end of the second driven push rod 242 and one end of the third driven push rod 243 through a rotating shaft C4; the other end of the second driven push rod 242 is connected to one end of the first driven push rod 241 through a rotating shaft C3, and a middle part of the second driven push rod is fixedly connected to the web plate of the supporting frame through a rotating shaft A1; the other end of the first driven push rod 241 is connected to the third connecting rod through a rotating shaft B1, and the other end of the third driven push rod 243 is connected to the fourth connecting rod through a rotating shaft B2.

Figure 5:
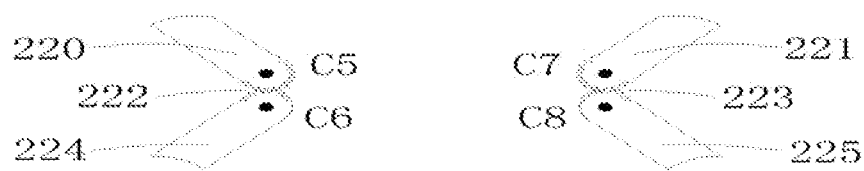
FIG. 5 illustrates a structural schematic diagram of a first connecting piece and a second connecting piece in a lifting mechanism structure of a rollable display device according to the present disclosure.

Further, referring to FIG. 5, each of the first connecting piece 222 and the second connecting piece 223 is engaged through a gear; the first connecting piece 222 comprises a gear structure arranged at the other end of the first connecting rod 220 and a gear structure arranged at one end of the third connecting rod 224, and one end of the first connecting rod 220 and one end of the third connecting rod 224 are engaged with each other respectively through a rotating shaft C5 and a rotating shaft C6; similarly, the second connecting piece 223 comprises a gear structure arranged at the other end of the second connecting rod 221 and a gear structure arranged at one end of the fourth connecting rod 225, and the other end of the second connecting rod 221 and one end of the fourth connecting rod 225 are engaged with each other respectively through a rotating shaft C7 and a rotating shaft C8, thus ensuring effective transmission of force between the connecting rods through gear engagement and achieving an anti-skid effect.

The rotating shafts A1, A2, A3 and A4 are fixed shafts, and components connected to the rotating shafts A1, A2, A3 and A4 only can do rotating motion around them; components connected to the rotating shafts B1 and B2 may do left-and-right linear motion along with the first sliding groove and the second sliding groove on the web plate of the supporting frame while doing rotating motion; the rotating shafts C1, C2, C3, C4, C5, C6, C7 and C8 may displace with the connecting rods in addition to rotation; and center distances of the rotating shafts A2-C6, C5-C1, A3-C8 and C7-C2 are the same.

Figure 6:
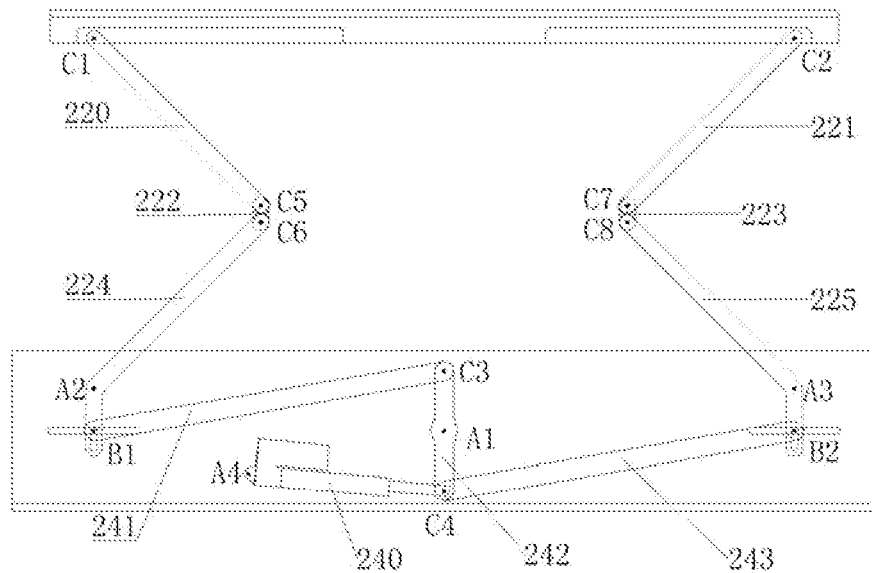
FIG. 6 illustrates a working schematic diagram of a first embodiment of a lifting mechanism of a rollable display device according to the present disclosure.

Referring to FIG. 6, the working process of the first specific application embodiment of the lifting mechanism is further described as follows:

The push rod assembly 24 is a power source, the power push rod 240 may be driven by be driven by electric, pneumatic, hydraulic, etc, and the specific power mode is not limited in the present disclosure, the power push rod 240 generate power to push the second driven push rod 242 and the third driven push rod 243 connected to the rotating shaft C4, so that the second driven push rod 242 does rightward arc displacement around the point of the rotating shaft A1, the third driven push rod 243 does rightward linear motion; meanwhile, the rotating shaft C3 connected to the second driven push rod 242 pushes the first driven push rod 241 to do leftward linear motion, the third driven push rod 243 and the first driven push rod 241 push the rotating shaft B2 and B1 to slide leftwards and rightwards respectively so as to push the fourth connecting rod 225 to rotate anticlockwise around the A3 point and the third connecting rod 224 to rotate clockwise around the A2 point; the fourth connecting rod 225 pulls the second connecting rod 221 to rotate clockwise around the rotating shaft C2, and the third connecting rod 224 pulls the first connecting rod 220 to rotate anticlockwise around the rotating shaft C1, so that folding of the fourth connecting rod 225 and the second connecting rod 221 as well as a folding dynamic trend of the connecting rod 224 and the connecting rod 220 are formed, and the cross beam 21 is driven to move down; and of course, the power push rod 240 shown in FIG. 6 only extends partially, for example, the rotating shaft C4 is pushed to the rightmost end of the design, the fourth connecting rod 225 and the second connecting rod 221 as well as the third connecting rod 224 and the first connecting rod 220 are completely folded, and the cross beam is driven to move down to the bottommost end. It is conceivable that under the condition that the rotating shaft C4 is not at the leftmost end of the design, when the power push rod 240 pulls the rotating shaft C4 to move leftwards, the cross beam 21 is driven to move up according to a connecting rod linkage principle.

Embodiment 2

Figure 7:
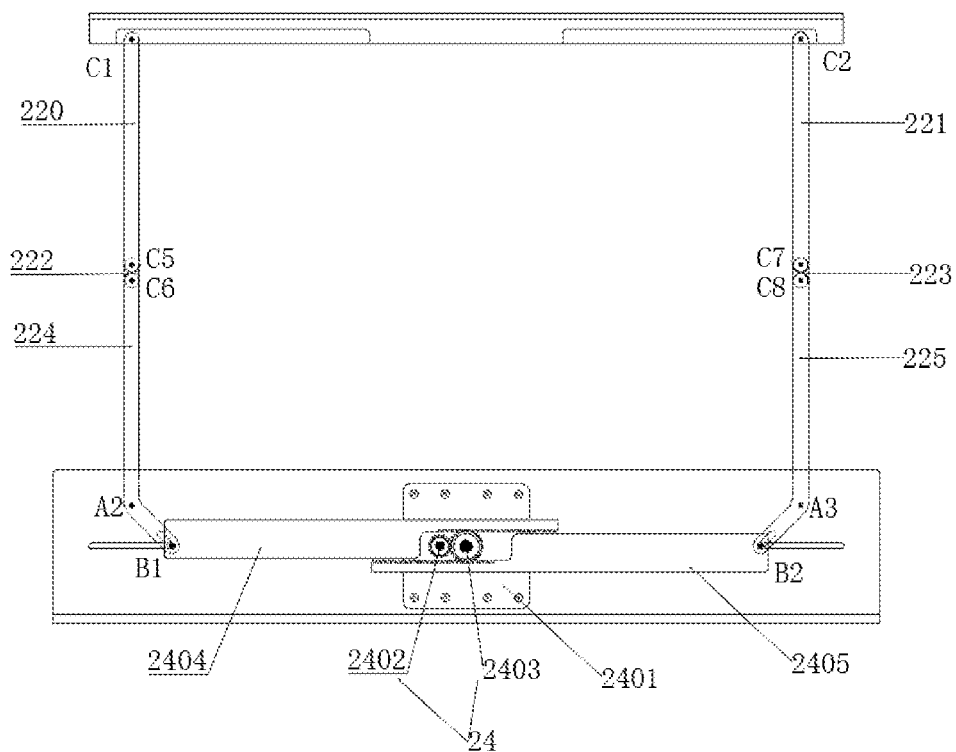
FIG. 7 illustrates a working schematic diagram of a second embodiment of a lifting mechanism of a rollable display device according to the present disclosure.

Referring to FIG. 7, optionally, the lifting mechanism of the present disclosure further comprises a second implementation manner.

The push rod assembly 24 further comprises a fixed base 2401, and a power gear 2402, a transmission gear 2403, a first rack push rod 2404 and a second rack push rod 2405 which are arranged on the fixed base 2401;

the fixed base 2401 is arranged on the supporting frame 23, the transmission gear 2403 is engaged with the power gear 2402, one end of the first rack push rod 2404 and one end of the second rack push rod 2405 respectively; and the other end of the first rack push rod 2404 and the other end of the second rack push rod 2405 are connected to the connecting rod assembly 22 respectively.

Specifically, the first rack push rod 2404 and the second rack push rod 2405 are limited by the fixed base 2401 in up-and-down and front-and-rear directions and may slide relative to the fixed base 2401. The power gear 2402 and the transmission gear 2403 are engaged with each other, can only rotate, but cannot move. The transmission gear 2403 is engaged with the first rack push rod 2404 and the second rack push rod 2405 mutually, the first rack push rod 2404 and the third connecting rod 224 are connected at the position of the rotating shaft B1, the second rack push rod 2405 and the fourth connecting rod 225 are connected at the position of the rotating shaft B2, the power gear 2402 is connected to a motor, and the motor rotates to drive the power gear 2402 to rotate so as to drive the transmission gear 2403 to rotate. The first rack push rod 2404 and the second rack push rod 2405 which are engaged with the transmission gear 2403 move rightwards or leftwards respectively. Of course, leftward or rightward motion of the rack is realized by changing the rotating direction of the gear. The control process of driving the connecting rod assembly 22 to control the flexible display screen 10 to move up and down has been described in the first implementation manner, thereby not being elaborated herein.

Embodiment 3

Figure 8:
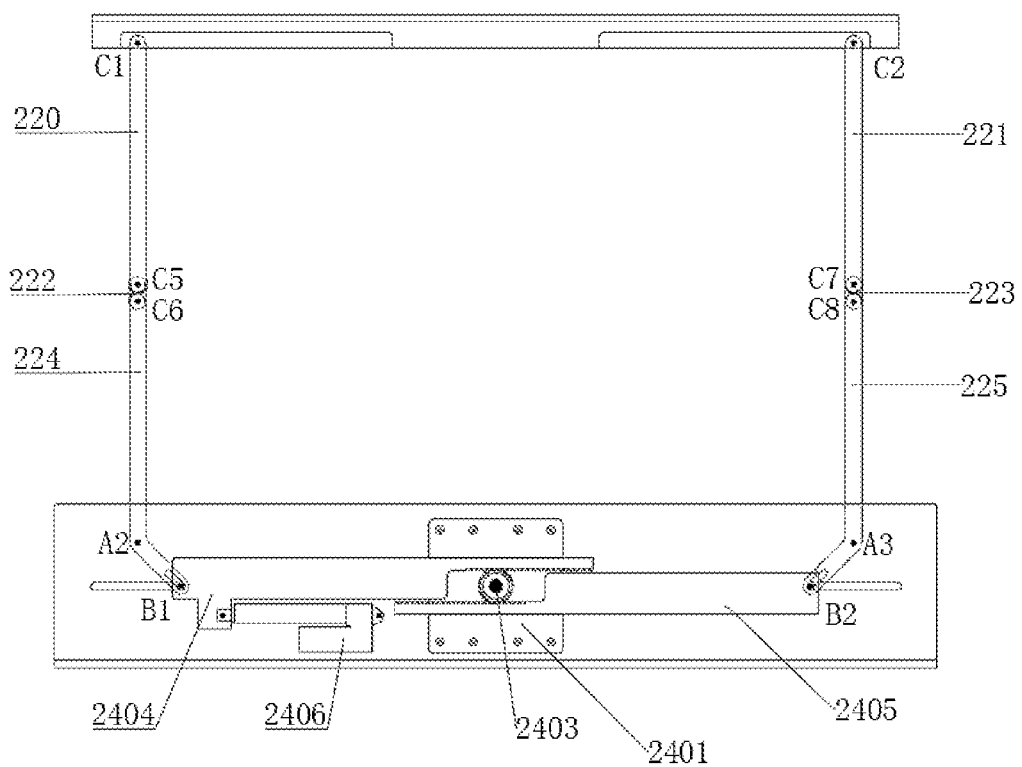
FIG. 8 illustrates a working schematic diagram of a third embodiment of a lifting mechanism of a rollable display device according to the present disclosure.

Referring to FIG. 8, optionally, the lifting mechanism of the present disclosure further comprises a third implementation manner.

The push rod assembly 24 further comprises a first power push rod 2406, a fixed base 2401, and a transmission gear 2403, a first rack push rod 2404 and a second rack push rod 2405 which are arranged on the fixed base, wherein the first power push rod 2406 and the fixed base 2401 are arranged on the supporting frame 23, and the transmission gear 2403 is engaged with one end of the first rack push rod 2404 and one end of the second rack push rod 2405 respectively; the other end of the first rack push rod 2404 is connected to the first power push rod 2406 and the connecting rod assembly 22 respectively; and the other end of the second rack push rod 2405 is connected to the connecting rod assembly 22.

Specifically, the first rack push rod 2404 and the second rack push rod 2405 are limited by the fixed base 2401 in up-and-down and front-and-rear directions and may slide relative to the fixed base 2401. The transmission gear 2403 can only rotate, but cannot move. The transmission gear 2403 is engaged with the first rack push rod 2404 and the second rack push rod 2405 mutually, the first rack push rod 2404 and the third connecting rod 224 are connected at the position of the rotating shaft B1, the second rack push rod 2405 and the fourth connecting rod 225 are connected at the position of the rotating shaft B2, and the first power push rod 2406 generates a thrust to push the first rack push rod 2404 to move leftwards so as to drive the transmission gear 2403 engaged with the first rack push rod 2404 to rotate and the second rack push rod 2405 engaged with the transmission gear 2403 to move rightwards. The control process of driving the connecting rod assembly 22 to control the flexible display screen 10 to move up and down has been described in the first implementation manner, thereby not being elaborated herein.

Embodiment 4

Figure 9:
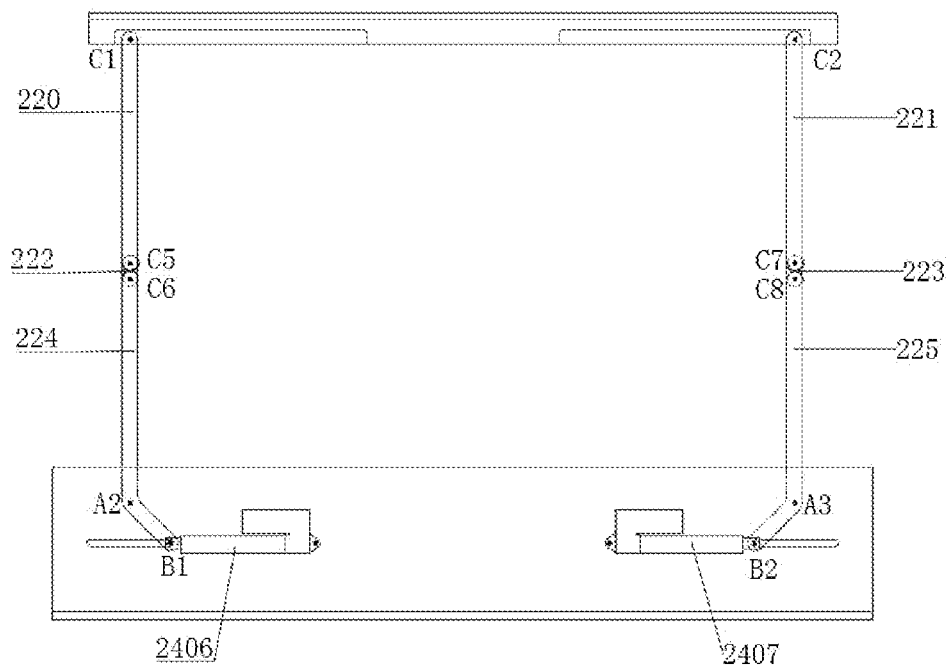
FIG. 9 illustrates a working schematic diagram of a fourth embodiment of a lifting mechanism of a rollable display device according to the present disclosure.

Referring to FIG. 9, optionally, the lifting mechanism of the present disclosure further comprises a fourth implementation manner.

The push rod assembly 24 further comprises a first power push rod 2406 and a second power push rod 2407;

one end of the first power push rod 2406 and one end of the second power push rod 2407 are arranged on the supporting frame 23; and the other end of the first power push rod 2406 and the other end of the second power push rod 2407 are connected to the connecting rod assembly 22 respectively.

Specifically, the first power push rod 2406 and the third connecting rod 224 are connected at the position of the rotating shaft B1, the second power push rod 2407 and the fourth connecting rod 225 are connected at the position of the rotating shaft B2, the first power push rod 2406 generates a thrust to push the third connecting rod 224 to move leftwards, and the second power push rod 2407 generates a thrust to push the fourth connecting rod 225 to move rightwards, so that the fourth connecting rod 225 pulls the second connecting rod 221 to rotate clockwise around the rotating shaft C2; and the third connecting rod 224 pulls the first connecting rod 220 to rotate anticlockwise around the rotating shaft C1, so that folding of the fourth connecting rod 225 and the second connecting rod 221 as well as a folding trend of the connecting rod 224 and the connecting rod 220 are formed, and the cross beam 21 is driven to move down. The control process of driving the connecting rod assembly 22 to control the flexible display screen 10 to move up has been described in the first implementation manner, thereby not being elaborated herein.

Figure 10:
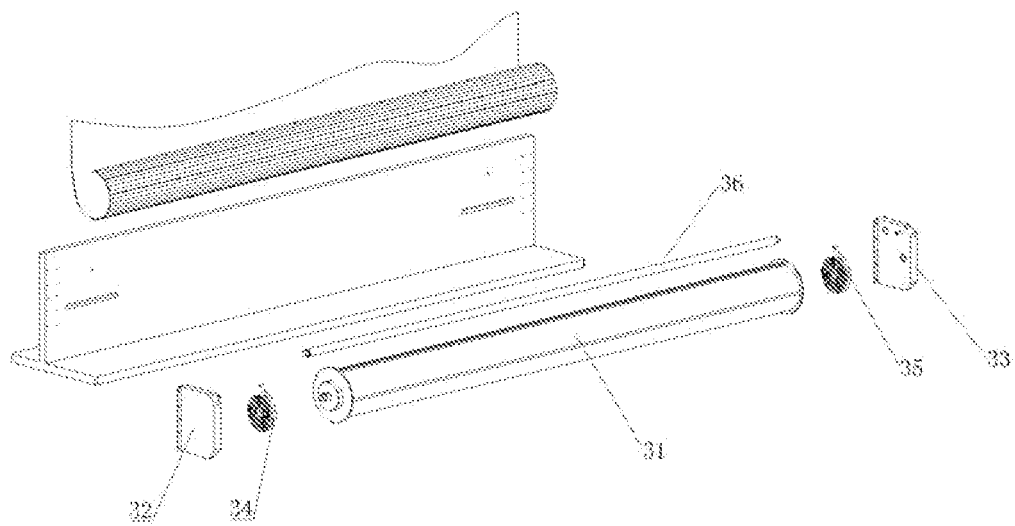
FIG. 10 illustrates a structural schematic diagram of a rollable screen mechanism of a rollable display device according to the present disclosure.
Figure 11:
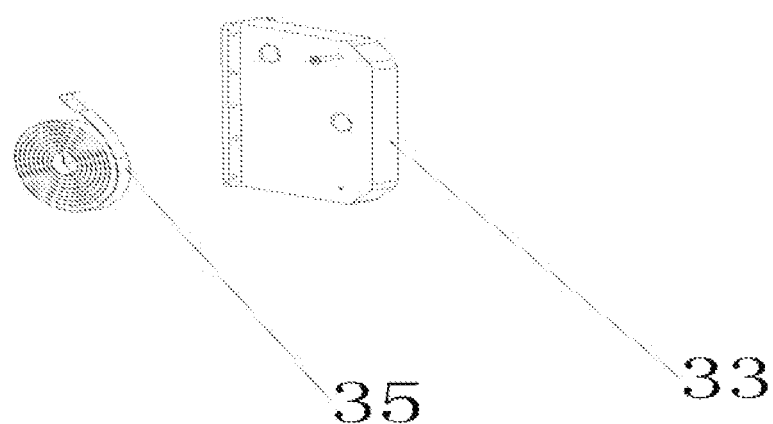
FIG. 11 illustrates an enlarged view of a second coil spring structure in a rollable screen mechanism of a rollable display device according to the present disclosure.

Referring to FIG. 10 and FIG. 11, the rollable screen mechanism 30 comprises a winding shaft 31, a first shaft base 32, a second shaft base 33, a first coil spring 34, a second coil spring 35 and a limiting shaft 36;

the winding shaft 31 is arranged in the middle of the first shaft base 32 and the second shaft base 33 and is connected to the bottom end of the flexible display screen 10, and the first shaft base 32 and the second shaft base 33 are symmetrically arranged on the supporting frame 23;

one end of the first coil spring 34 and one end of the second coil spring 35 are connected to the first shaft base 32 and the second shaft base 33 respectively, and the other end of the first coil spring 34 and the other end of the second coil spring 35 are connected to two ends of the winding shaft 31 respectively; and the limiting shaft 36 is arranged above the winding shaft 31 parallelly, and two ends of the limiting shaft 36 are connected to the first shaft base 32 and the second shaft base 33 respectively.

In the embodiment, the first shaft base 32 and the second shaft base 33 of the rollable screen mechanism 30 are symmetrically mounted on the web plate of the supporting frame 23, the winding shaft 31 is mounted in the middle of the first shaft base 32 and the second shaft base 33, a column surface of the wind shaft is connected to the bottom end of the flexible display screen 10, column surfaces of stepped shafts with smaller diameter at two ends of the winding shaft 31 are connected to one end of the first coil spring 34 and one end of the second coil spring 35 respectively, the other end of the first coil spring and the other end of the second coil spring are connected to the first shaft base 32 and the second shaft base 33, the flexible display screen 10 is driven by a pre-tightening force provided by the two coil springs to roll or release, and the pre-tightening force may be adjusted by adjusting the number of rolling turns during connection of the coil springs. It should be noted that the winding shaft 31 is connected to the first shaft base 32 and the second shaft base 33 in a freely rotatable manner, and the specific connection manner is not limited in the present disclosure.

Specifically, when the lifting mechanism drives the flexible display screen to move up, the lifting mechanism 20 drives the cross beam 21 to drive the upper end of the flexible display screen 10 to move upward, the lower end part of the flexible display screen 10 drives the winding shaft 31 to rotate, the screen body of the flexible display screen 10 rolled by the winding shaft 31 is released, meanwhile, the first coil spring 34 and the second coil spring 35 which are connected to the stepped shafts at the two ends of the winding shaft 31 are subjected to a torsional stress of the winding shaft 31 to become tighter and tighter until the flexible display screen 10 moves up to a preset maximum height. Further, when the lifting mechanism 20 drives the flexible display screen 10 to move down, the lifting mechanism 20 drives the cross beam 21 to drive the upper end of the flexible display screen 10 to move downward, the pre-tightening force of the first coil spring 34 and the second coil spring 35 in the rollable screen mechanism 30 is released, the winding shaft 31 is driven to rotate, and lower end part of the flexible display screen 10 is rolled along with rotation of the winding shaft 31. When the screen body of the flexible display screen 10 is rolled to the bottommost end, a reverse elastic force of the coil springs may be adjusted by adjusting a coil spring force of the first coil spring 34 and the second coil spring 35 and through the number of winding turns of the coil spring during fixation of the two coil springs and the two shaft bases, so that the winding shaft 31 maintains a certain screen rolling force, wherein the limiting shaft 36 is arranged obliquely above the winding shaft 31 parallelly, so that the front-and-rear position of the screen body may be limited conveniently when the flexible display screen 10 extends out.

Figure 12:
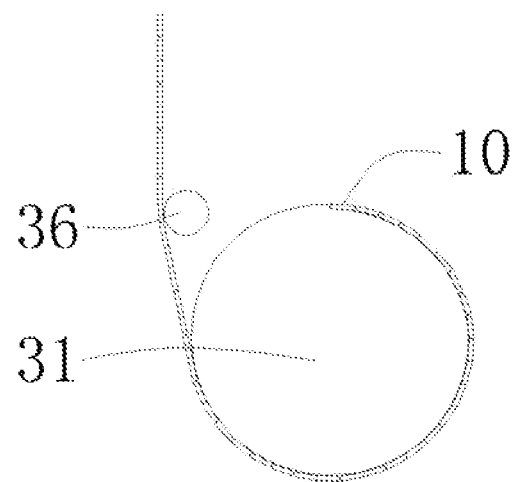
FIG. 12 illustrates a connection schematic diagram of a winding shaft and a flexible display screen in a rollable screen mechanism of a rollable display device according to the present disclosure.

It is worth mentioning that referring to FIG. 12, the column surface of the winding shaft 31 is not a cylindrical surface, the winding shaft 31 has a step along an axis direction, a thickness of the step is consistent with a thickness of the flexible display screen 10, and a lower end of the screen body of the flexible display screen 10 is fixed below the step and forms a gentle column surface together with the step.

Figure 13:
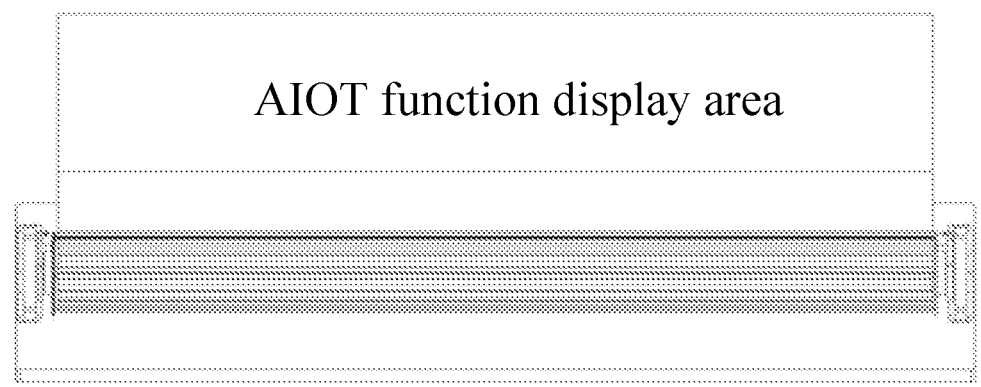
FIG. 13 illustrates an application example diagram of a rollable display device according to the present disclosure.

Further, the rollable display device may further be applied to an intelligent terminal, as shown in FIG. 13.

In the embodiment, since the traditional intelligent terminal display screen cannot be rolled and there is no corresponding rollable screen mechanism technology, for example, with the development of artificial intelligence Internet of Things (AIOT) technology and the rise of products, there is an increasing demand for the secondary screen to display AIOT related state information. By the above rollable display device, lifting and rolling of the screen body of the flexible display screen may be performed at the same time, a lifting height of the flexible display screen is controlled by controlling a push position of the push rod assembly, different heights may correspond to different application screens, for example, when the screen body of the flexible display screen is lifted by only one third, the flexible display screen may serve as an AIOT product display terminal to display related information, and the use function of the big screen is shown when the screen body of the flexible display screen is lifted to a full size.

Based on the above rollable display device of a semiconductor, the present disclosure further provides an intelligent terminal. The intelligent terminal comprises the above rollable display device. It should be understood that the intelligent terminal further comprises other existing structures, thus not being elaborated herein.

The present disclosure provides a rollable display device and an intelligent terminal. The rollable display device comprises a flexible display screen, a lifting mechanism connected to a top end of the flexible display screen, and a rollable screen mechanism connected to a bottom end of the flexible display screen, wherein the lifting mechanism is configured to drive the flexible display screen to move up or down; and the rollable screen mechanism is configured to unfold the flexible display screen when the lifting mechanism drives the flexible display screen to move up or roll up the flexible display screen when the lifting mechanism drives the flexible display screen to move down, thereby realizing lifting and rolling of the screen with no limitation to the volume of the display screen, greatly reducing the occupied space of the display screen, overcoming the problem that the traditional display device is not portable and bringing convenience to users.

It may be understood that for those skilled in the art, equivalent substitutions or changes may be made according to the technical solution and the invention concept of the present disclosure, and all these changes or substitutions should belong to the protection scope of the appended claims of the present disclosure.

What is claimed is:

1. A rollable display device, comprising:
a flexible display screen, a lifting mechanism connected to a top end of the flexible display screen, and a rollable screen mechanism connected to a bottom end of the flexible display screen, wherein
the lifting mechanism is configured to drive the flexible display screen to move up or down;
the rollable screen mechanism is configured to unfold the flexible display screen when the lifting mechanism drives the flexible display screen to move up or roll up the flexible display screen when the lifting mechanism drives the flexible display screen to move down;
the lifting mechanism comprises: a cross beam, a supporting frame, and at least one connecting rod assembly and a push rod assembly which are arranged on the supporting frame;
the cross beam is connected to the top end of the flexible display screen;
the connecting rod assembly is connected to the cross beam and is configured to drive the cross beam to move up or down;
the push rod assembly is connected to the connecting rod assembly and is configured to generate a telescoping motion to transmit power to the connecting rod assembly;
the at least one connecting rod assembly comprises a first connecting rod assembly and a second rod connecting assembly that are oppositely located and whose top ends are respectively connected to the cross beam;
the push rod assembly comprises a power push rod, a first driven push rod, a second driven push rod and a third driven push rod;
the power push rod is fixedly arranged on the supporting frame and is connected to one end of the second driven push rod and one end of the third driven push rod;
the other end of the second driven push rod is connected to one end of the first driven push rod;
the other end of the first driven push rod is connected to a bottom end of the first connecting rod assembly; and the other end of the third driven push rod is connected to a bottom end of the second connecting rod assembly.

2. The rollable display device according to claim 1, wherein the supporting frame is provided with a first sliding groove and a second sliding groove; the connecting rod assembly comprises a first connecting rod, a second connecting rod, a first connecting piece, a second connecting piece, a third connecting rod and a fourth connecting rod;
one end of the first connecting rod and one end of the second connecting rod are connected to two ends of the cross beam respectively, the other end of the first connecting rod is connected to one end of the third connecting rod through the first connecting piece, and the other end of the second connecting rod is connected to one end of the fourth connecting rod through the second connecting piece; and
the other end of the third connecting rod and the other end of the fourth connecting rod are connected to the push rod assembly respectively through the first sliding groove and the second sliding groove.

3. The rollable display device according to claim 2, wherein the supporting frame comprises a web plate and a wing plate; and the web plate is vertical to the wing plate, and the first sliding groove and the second sliding groove are symmetrically formed in the web plate.

4. The rollable display device according to claim 3, wherein each of the third connecting rod and the fourth connecting rod is provided with a corner, and the corner of the third connecting rod and the corner of the fourth connecting rod are respectively arranged at two ends of the web plate.

5. The rollable display device according to claim 2, wherein each of the first connecting piece and the second connecting piece is engaged through a gear.

6. The rollable display device according to claim 5, wherein the first connecting piece comprises a gear structure arranged at the other end of the first connecting rod and a gear structure arranged at one end of the third connecting rod, one end of the first connecting rod being engaged with one end of the third connecting rod; and the second connecting piece comprises a gear structure arranged at the other end of the second connecting rod and a gear structure arranged at one end of the fourth connecting rod, the other end of the second connecting rod being engaged with one end of the fourth connecting rod.

7. The rollable display device according to claim 1, wherein the rollable screen mechanism comprises: a winding shaft, a first shaft base, a second shaft base, a first coil spring, a second coil spring and a limiting shaft;
the winding shaft is arranged in the middle of the first shaft base and the second shaft base and is connected to the bottom end of the flexible display screen, and the first shaft base and the second shaft base are symmetrically arranged on the supporting base;
one end of the first coil spring and one end of the second coil spring are connected to the first shaft base and the second shaft base respectively, and the other end of the first coil spring and the other end of the second coil spring are connected to two ends of the winding shaft respectively; and
the limiting shaft is arranged obliquely above the winding shaft parallelly, and two ends of the limiting shaft are connected to the first shaft base and the second shaft base respectively.

8. The rollable display device according to claim 1, wherein a plurality of flat metal laths are stuck at a back of the flexible display screen.

9. The rollable display device according to claim 7, wherein a step is arranged at an axis direction of the winding shaft, and a thickness of the step is consistent with a thickness of the flexible display screen.

10. An intelligent terminal, comprising a rollable display device, the rollable display device comprising:
a flexible display screen, a lifting mechanism connected to a top end of the flexible display screen, and a rollable screen mechanism connected to a bottom end of the flexible display screen, wherein
the lifting mechanism is configured to drive the flexible display screen to move up or down; and
the rollable screen mechanism is configured to unfold the flexible display screen when the lifting mechanism drives the flexible display screen to move up or roll up the flexible display screen when the lifting mechanism drives the flexible display screen to move down;
the lifting mechanism comprises: a cross beam, a supporting frame, and a connecting rod assembly and a push rod assembly which are arranged on the supporting frame;
the cross beam is connected to the top end of the flexible display screen;
the connecting rod assembly is connected to the cross beam and is configured to drive the cross beam to move up or down;
the push rod assembly is connected to the connecting rod assembly and is configured to transmit power to the connecting rod assembly;
the at least one connecting rod assembly comprises a first connecting rod assembly and a second rod connecting assembly that are oppositely located and whose top ends are respectively connected to the cross beam; the push rod assembly comprises a power push rod, a first driven push rod, a second driven push rod and a third driven push rod; the power push rod is fixedly arranged on the supporting frame and is connected to one end of the second driven push rod and one end of the third driven push rod; the other end of the second driven push rod is connected to one end of the first driven push rod; and the other end of the first driven push rod is connected to a bottom end of the first connecting rod assembly and the other end of the third driven push rod is connected to a bottom end of the second connecting rod assembly.

* * * * *